(12) United States Patent
Ayranci et al.

(10) Patent No.: US 10,862,441 B2
(45) Date of Patent: *Dec. 8, 2020

(54) PROGRAMMABLE OPTIMIZED BAND SWITCHING LNA FOR OPERATION IN MULTIPLE NARROW-BAND FREQUENCY RANGES

(71) Applicant: pSemi Corporation, San Diego, CA (US)

(72) Inventors: Emre Ayranci, Costa Mesa, CA (US); Miles Sanner, San Diego, CA (US)

(73) Assignee: pSemi Corporation, San Diego, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/664,646

(22) Filed: Oct. 25, 2019

(65) Prior Publication Data

US 2020/0127618 A1 Apr. 23, 2020

Related U.S. Application Data

(63) Continuation of application No. 15/910,924, filed on Mar. 2, 2018, now Pat. No. 10,476,453, which is a
(Continued)

(51) Int. Cl.
*H03F 3/191* (2006.01)
*H03F 1/22* (2006.01)
(Continued)

(52) U.S. Cl.
CPC .......... *H03F 3/195* (2013.01); *H03F 1/0205* (2013.01); *H03F 1/0261* (2013.01); *H03F 1/223* (2013.01);
(Continued)

(58) Field of Classification Search
CPC . H03F 1/22; H03F 1/223; H03F 1/226; H03F 3/191; H03F 3/193
(Continued)

(56) References Cited

U.S. PATENT DOCUMENTS 7,323,939 B2   1/2008 Han et al.
8,102,213 B2   1/2012 Tasic et al.
(Continued)

OTHER PUBLICATIONS

Mottola, Steven, Office Action received from the USPTO dated Dec. 7, 2017 for U.S. Appl. No. 15/430,332, 14 pgs.
(Continued)

*Primary Examiner* — Steven J Mottola
(74) *Attorney, Agent, or Firm* — Jaquez Land Greenhaus LLP; Bruce W. Greenhaus, Esq.

(57) ABSTRACT

A front end module (FEM) integrated circuit (IC) architecture that uses the same LNA in each of several frequency bands extending over a wide frequency range. In some embodiments, switched impedance circuits distributed throughout the front end circuit allow selection of the frequency response and impedances that are optimized for particular performance parameters targeted for a desired device characteristic. Such switched impedance circuits tune the output and input impedance match and adjust the gain of the LNA for specific operating frequencies and gain targets. In addition, adjustments to the bias of the LNA can be used to optimize performance trade-offs between the total direct current (DC) power dissipated versus radio frequency (RF) performance. By selecting appropriate impedances throughout the circuit using switched impedance circuits, the LNA can be selectively tuned to operate optimally at a selected bias for operation within selected frequency bands.

17 Claims, 12 Drawing Sheets

Related U.S. Application Data continuation of application No. 15/430,332, filed on Feb. 10, 2017, now Pat. No. 9,941,849.

(51) Int. Cl.
| | |
|---|---|
| *H03F 3/195* | (2006.01) |
| *H03F 1/02* | (2006.01) |
| *H03H 11/28* | (2006.01) |
| *H04B 1/16* | (2006.01) |
| *H03H 7/38* | (2006.01) |
| *H03F 1/56* | (2006.01) |
| *H03F 3/193* | (2006.01) |
| *H03F 3/72* | (2006.01) |
| *H04B 1/00* | (2006.01) |

(52) U.S. Cl.
CPC ............ *H03F 1/565* (2013.01); *H03F 3/193* (2013.01); *H03F 3/72* (2013.01); *H03H 7/38* (2013.01); *H03H 11/28* (2013.01); *H04B 1/006* (2013.01); *H04B 1/16* (2013.01); *H03F 2200/111* (2013.01); *H03F 2200/294* (2013.01); *H03F 2200/387* (2013.01); *H03F 2200/451* (2013.01); *H03F 2203/7209* (2013.01); *H03F 2203/7236* (2013.01)

(58) Field of Classification Search
USPC ......................................... 330/283, 305, 311
See application file for complete search history.

(56) References Cited

U.S. PATENT DOCUMENTS

| | | |
|---|---|---|
| 9,035,703 B2 | 5/2015 | Feng et al. |
| 9,077,290 B2 | 7/2015 | Din et al. |
| 9,407,215 B2 | 8/2016 | Gill |
| 9,941,849 B1 | 4/2018 | Ayranci et al. |
| 10,476,453 B2 | 11/2019 | Ayranci et al. |
| 2005/0248402 A1 | 11/2005 | Zhenbiao et al. |
| 2018/0358938 A1 | 12/2018 | Ayranci et al. |

OTHER PUBLICATIONS

Mottola, Steven, Notice of Allowance received from the USPTO dated Dec. 12, 2018 for U.S. Appl. No. 15/430,332, 5 pgs.
Ayranci, et al., Response filed in the USPTO dated Jan. 26, 2018 for U.S. Appl. No. 15/430,332, 13 pgs.
Mottola, Steven J., Office Action received from the USPTO dated Mar. 25, 2019 for U.S. Appl. No. 15/910,924, 9 pgs.
Mottola, Steven J., Notice of Allowance received from the USPTO dated Jun. 24, 2019 for U.S. Appl. No. 15/910,924, 5 pgs.
Mottola, Steven J., Notice to File Corrected Application Papers received from the USPTO dated Aug. 28, 2019 for U.S. Appl. No. 15/910,924, 3 pgs.
PSEMI Corporation, Preliminary Amendment filed in the USPTO dated Aug. 31, 2018 for U.S. Appl. No. 15/910,924, 9 pgs.
PSEMI Corporation, Response filed in he USPTO dated Jun. 6, 2019 for U.S. Appl. No. 15/910,924, 8 pgs.
PSEMI Corporation, Response filed in he USPTO dated Aug. 29, 2019 for U.S. Appl. No. 15/910,924, 3 pgs.
Zhang, et al., "Linearization Techniques for CMOS Low Noise Amplifiers: A Tutorial", IEEE Transactions on Circuits and Systems—I: Regular Papers, vol. 58, No. 1, Jan. 2011, pp. 22-36.

PROGRAMMABLE OPTIMIZED BAND SWITCHING LNA FOR OPERATION IN MULTIPLE NARROW-BAND FREQUENCY RANGES

CROSS REFERENCE TO RELATED APPLICATION—CLAIM OF PRIORITY

This application is a continuation of, and claims the benefit of priority under 35 USC § 120 of, commonly assigned and co-pending prior U.S. application Ser. No. 15/910,924, filed Mar. 2, 2018, "Programmable Optimized Band Switching LNA for Operation in Multiple Narrow-Band Frequency Ranges", the disclosure of which is incorporated herein by reference in its entirety, which is a continuation of and claims the benefit of priority under 35 USC § 120 of, commonly assigned and prior U.S. application Ser. No. 15/430,332, filed Feb. 10, 2017, "Programmable Optimized Band Switching LNA for Operation in Multiple Narrow-Band Frequency Ranges", now U.S. Pat. No. 9,941,849, issued Apr. 10, 2018, the disclosure of which is incorporated herein by reference in its entirety.

BACKGROUND

(1) Technical Field

This invention generally relates to radio frequency RF front ends, and more specifically to RF front ends for receivers that receive signals in multiple narrow-band frequency ranges.

(2) Background

In many instances today, it is useful to have a radio frequency (RF) front end module (FEM) capable of supporting several bands covering a wide frequency range. There are significant challenges to designing a high performance low noise amplifier (LNA) for use in a RF FEM that can operate in several bands spread over a wide frequency range. In some embodiments, an attempt to overcome these challenges is made by using several narrowband LNAs, each covering a subset of the bands in which the FEM is required to operate. However, providing several LNAs requires significant allocation of area on the integrated circuit (IC) on which the LNAs are fabricated. The cost of the IC is proportional to the size of the IC (i.e., the amount of "real estate" required). Therefore, relying on several narrowband LNAs significantly increases the overall cost of the IC.

FIG. 1 is a simplified schematic of an RF front end circuit 100 that uses several LNAs to support operations in multiple bands over a wide range of frequencies. The front end circuit 100 is shown with only those components that are relevant to the present discussion. Additional components that are typically provided in the front end circuit 100 are not shown in FIG. 1 to reduce the complexity of the figure and the associated discussion. Each LNA 102 comprises two FETs 104, 106 operating in a cascode configuration. The first FET is configured as a "common source" input FET 104. The second FET is configured as a "cascode" output FET 106. The input signal is applied to an input port 108 of the front end circuit 100. The input port 108 is coupled to an antenna switch 109. The antenna switch 109 couples a received signal to one of several filters 111, 113, 115. Each filter is tuned to a select frequency band. The output of each filter 111, 113, 115 is coupled to the input of one of the LNAs 102, depending upon the particular frequency band of the signals applied to the input port 108. The output of each filter is coupled to an input impedance matching circuit 110 associated with the selected LNA 102. The output of the matching circuit 110 is coupled to the gate of the input FET 104 of the selected LNA 102. In some cases, the impedance matching circuit 110 comprises a series-coupled inductor 112 and capacitor 114. The frequency response of each LNA 102 is tuned to align with the frequency response of each filter 111, 113, 115. The values of the inductor 112 and the capacitor 114 of each matching network are also tuned to match the output impedance of the filter (e.g., 50 ohms) to the LNA input impedance for the frequency band over which the selected LNA 102 is to operate. A load inductor 116 is coupled between the drain of the output FET 106 and a supply source VDD. The output of the LNA is taken from the drain of the output FET 106. An output matching circuit comprising a capacitor 118 couples the output of the LNA to a front end output port 120. The values of the components in the output matching circuit (such as the capacitance of the capacitor 118) are selected to tune the output impedance to match the load to which the LNA 102 is to be coupled. In some cases, the outputs from each LNA 102 are provided to an output port 120 of the front end circuit 100. In other cases, the outputs are selected by an LNA output switch 122 that is "ganged" together (i.e., switches in coordination with) the antenna switch 109.

In light of the significant amount of IC "real estate" required to fabricate multiple LNAs 102, it can be seen that there is a need for a front end architecture suitable for use with multiple frequency bands and that does not require multiple LNAs. The present invention meets this need.

SUMMARY OF THE INVENTION

A front end circuit architecture is disclosed that uses the same LNA in each of several frequency bands extending over a wide frequency range. The LNA comprises two transistors, such as field effect transistors (FETs). The first FET is a "common source" configured input FET. The second FET is a "common gate" cascode configured output FET. In some embodiments, switched impedance circuits distributed throughout the front end circuit allow selection of the frequency response and impedances that are optimized for particular performance parameters targeted for a desired device characteristic. The particular performance parameters may be any one or combination of factors, such as noise figure, $g_m/(2\pi C_{gs})$, $C_{gs}$, etc., where $g_m$ is transconductance and $C_{gs}$ is gate to source capacitance in the FETs of the LNA.

In some embodiments, one switched impedance circuit is coupled between the gate of the LNA input FET and ground. An additional switched impedance circuit is coupled between the gate and source of an LNA input FET. Yet another switched impedance circuit is coupled between the drain of the LNA output FET and ground. Lastly, a switched impedance circuit is coupled in parallel with an output impedance matching circuit. Several embodiments are possible, since each of these switched impedance circuit can be provide either alone or in combination with one or more of the other switched impedance circuits.

In addition, adjustments to the bias of the LNA can be used to optimize performance trade offs between the total direct current (DC) power dissipated versus radio frequency (RF) performance. By selecting appropriate impedances throughout the circuit using switched impedance circuits, the LNA can be selectively tuned to operate optimally at a selected bias for operation within selected frequency bands.

The details of one or more embodiments of the invention are set forth in the accompanying drawings and the description below. Other features, objects, and advantages of the invention will be apparent from the description and drawings, and from the claims.

DESCRIPTION OF THE DRAWINGS

Like reference numbers and designations in the various drawings indicate like elements.

DETAILED DESCRIPTION OF THE INVENTION

Figure 1:
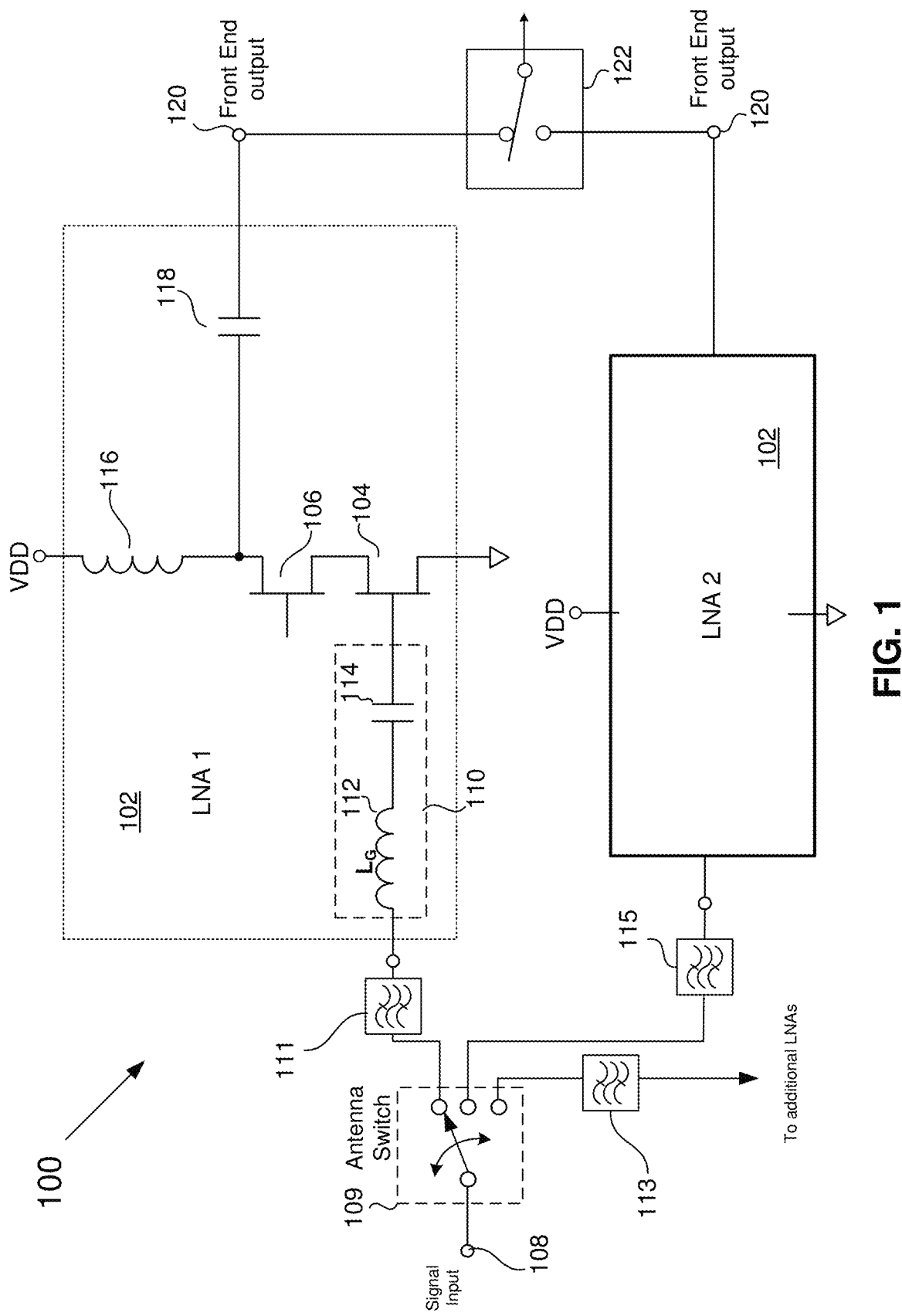
FIG. 1 is a simplified schematic of a front end circuit that uses several LNAs to support operations in multiple bands over a wide range of frequencies.
Figure 2:
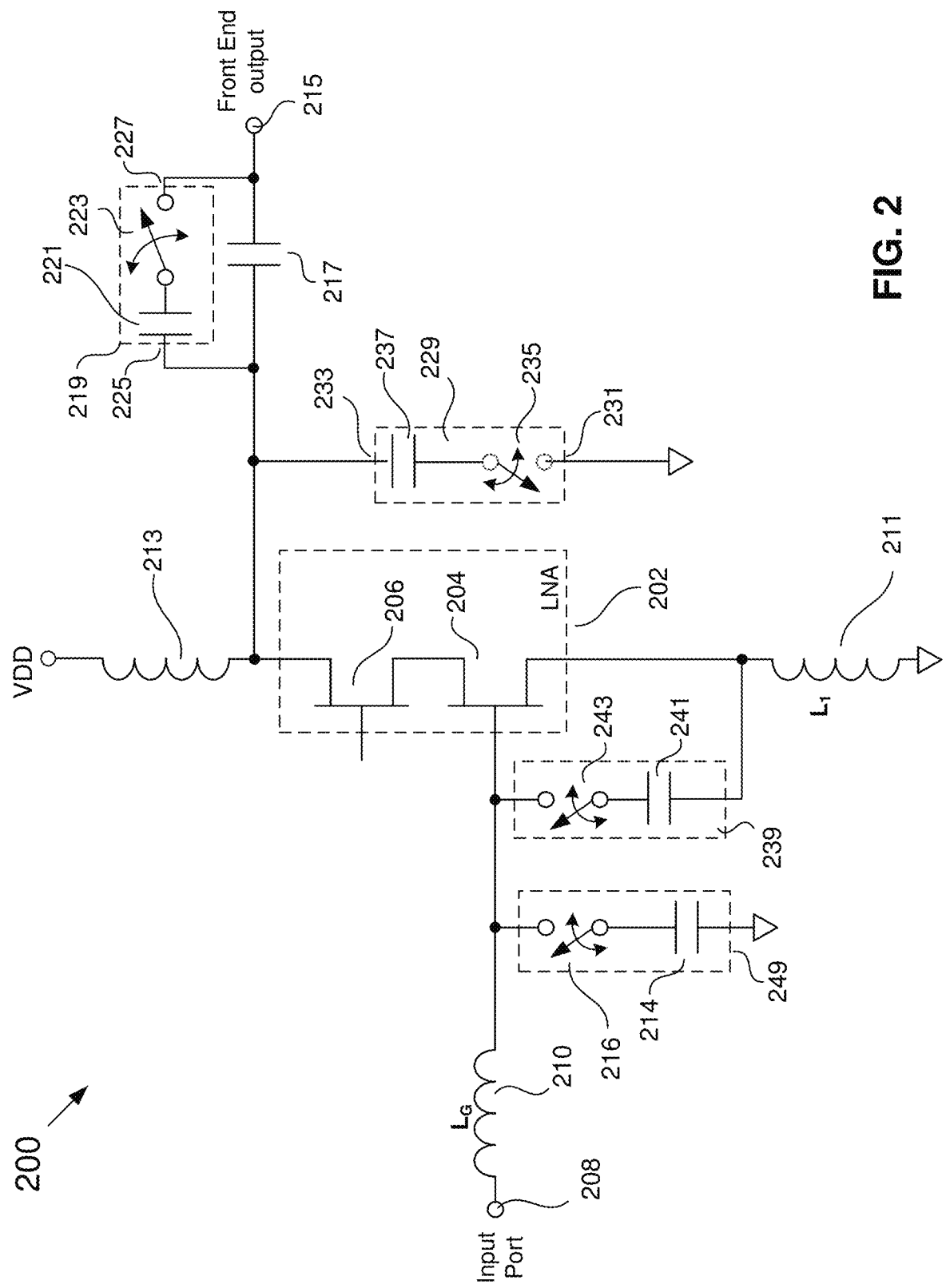
FIG. 2 is a simplified schematic of relevant components of a front end circuit including one LNA that is configurable for use in multiple frequency bands over a wide frequency range.

FIG. 2 is a simplified schematic of relevant components of a front end circuit 200 including one LNA 202 that is configurable for use in multiple frequency bands over a wide frequency range. As shown in FIG. 2, the front end circuit 202 has only one amplifier input for input signals of all frequencies to be coupled to the LNA 202. In some embodiments of the disclosed method and apparatus, the LNA 202 includes two transistors, such as field effect transistors (FETs) 204, 206. The first FET 204 is configured as a "common source" input FET. The second FET 206 is configured as a "common gate" output FET (or "cascode" configured output FET). In some embodiments, other types of transistors may be used, including, but not limited to, bipolar junction transistors. Furthermore, any type of FET may be used to implement the LNA, including, but not limited to metal-oxide semiconductors (MOSFETs), junction field effect transistors (JFETs), insulated gate FETs (IGFETs), metal semiconductor FETs (MESFETs), etc. While some types of transistors may be better suited to particular applications, the concepts associated with the disclosed method and apparatus do not exclude the use of any particular type of transistor. Still further, the LNA can be implemented either using a single transistor or with additional transistors within an LNA either as additional amplifier stages or stacked with those FETs 204, 206 that are shown.

In accordance with some such embodiments, an input signal is applied to an Input Port 208. An inductive element, such as an inductor 210, couples the signal to the gate of the input FET 204. In some embodiments, a degeneration inductance 211 is coupled between the source of the input FET 204 and ground. However, in other embodiments, the source of the FET 204 is coupled directly to ground. In some such embodiments, the conductor to ground provides sufficient inductance under some conditions. In addition, a load inductance 213 is coupled between the drain of the output FET 206 and the LNA power supply VDD. The output of the LNA 202 is taken from the source of the output FET 206 and coupled to a front end output port 215 by an output matching circuit, which in the simplest embodiment is a capacitor 217.

Figure 3:
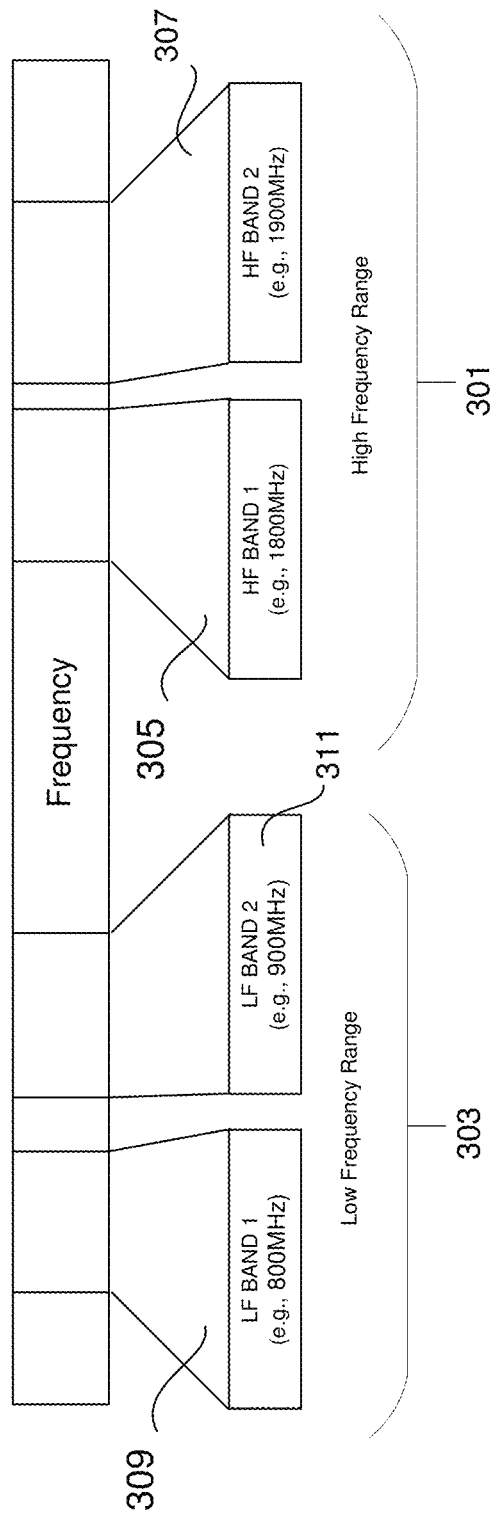
FIG. 3 is an illustration of one example of a frequency map showing multiple frequency bands over a wide frequency range over which the LNA operates.

FIG. 3 is an illustration of one example of a frequency map showing multiple frequency bands over a wide frequency range within which the LNA 202 operates. The frequency range in which the LNA 202 can operate may include one or more frequency bands. In some embodiments, the operation of the LNA is split into two frequency ranges: a high frequency range 301 and a low frequency range 303. In some embodiments, the high frequency range 301 includes two frequency bands 305, 307. While the frequency map of FIG. 3 shows two frequency bands 305, 307 within the high frequency range 301, in other embodiments, several more frequency bands may be present within the high frequency range 301. Similarly, the low frequency range 303 is shown to have two frequency bands 309, 311, yet in other embodiments, several more frequency bands may be present in the low frequency range 303. Frequency bands within each frequency range can be either contiguous or non-contiguous. Similarly, while only two frequency ranges 301, 303 are shown, in other embodiments, the LNA 202 may operate at frequencies that lie within several additional frequency ranges.

The frequencies shown in FIG. 3 are one example in which the front end circuit 200 is for use in a multi-band cellular phone capable of operating at frequencies used in multiple countries. The low frequency range 303 includes a first band (LF BAND 1) 309 at 800 MHz and a second band (LF BAND 2) 311 at 900 MHz. The high frequency range 301 includes a first band (HF BAND 1) 305 at 1800 MHz and a second band (HF BAND 2) 307 at 1900 MHz. In yet another example, the low frequency range includes a LF band at 700 MHz and the high frequency range includes a high frequency band at 2700 MHz.

In some embodiments, a parallel-coupled output switched impedance circuit (SIC) 219 is provided to allow the output impedance of the LNA 202 to be tuned to the particular frequency range 301, 303. In some embodiments, the SIC 219 is placed in parallel with the output impedance matching network. In some such embodiments, the output impedance matching network is merely the capacitor 217, as shown in FIG. 2. In accordance with some embodiments, the SIC 219 has a first terminal 225 and second terminal 227. A capacitor 221 and a switch 223 are placed in series between the first and second terminals 225, 227. In some embodiments, it is advantageous to have the capacitor 221 coupled to the drain of the FET 206 in order to act as a DC block to currents that might otherwise leak through the switch 223. However, in some embodiments, the SIC 219 can be reversed. That is, the first terminal and the second terminal can be reversed. Accordingly, in such embodiments it does not matter which terminal is connected to the LNA output and which terminal is connected to the front end output port 215. Furthermore, the SIC 219 can include any component or network of components forming a two-port network capable of providing impedance in the generalized form of a+bj. Furthermore, while for the sake of simplicity, the switch 216 is assumed to be a digitally controlled solid-state switch, any variable impedance device capable of controllably altering the impedance presented by the switched impedance circuit can be used.

In some embodiments, when operating in either HF BAND 1 or HF BAND 2, the SIC 219 is active (i.e., the switch 223 is closed). Activating the SIC 219 tunes the output impedance of the LNA 202 to a value that provides a match in the high frequency range 301. Alternatively, when operating in either LF BAND 1 or LF BAND 2, the SIC 219 is deactivated, causing the output impedance of the LNA 202 to more closely match the desired output impedance when operating in the low frequency range. As noted above, in other embodiments, the components of the SIC 219 can include other impedance altering components configured as a two-port switchable network. Such components can include inductors, resistors, additional capacitors etc. that can be coupled to form a switchable two-port network. The components within the two-port network of the SIC 219 can be configured either in series or parallel to allow the output impedance of the LNA 202 to be matched to a load as is appropriate for different frequency ranges by activating and deactivating the SIC 219.

In some embodiments, the LNA 202 further includes a shunt-coupled output SIC 229. The SIC 229 has a first terminal 233 connected to the drain of the output FET 206 and a second terminal 231 connected to ground. In some embodiments, the SIC 229 is provided together with the SIC 219. In other embodiments, the LNAs 202 does not have an SIC 219. Similar to the parallel-coupled output SIC 219, the shunt-coupled output SIC 229 is essentially a two-port switchable network. The SIC 229 has a network of impedance altering components, such as capacitors, inductors and resistors connected configured as a two-port network between the first and second terminal 231, 233 of the SIC 229. In some embodiments, the two-port network includes a switch 235 and capacitor 237 coupled in series between the first terminal 231 and the second terminal 233 of the SIC 229. The SIC 229 can be used to assist in tuning the output match. Depending upon the number of frequency ranges for which the LNA 202 can be tuned, the parallel-coupled SIC 219 and the shunt-coupled output SIC 229 can be either switched independently or together (i.e., "ganged" together) such that if one SIC is active, the other is active as well.

In some embodiments, the LNA 202 further includes an input shunt SIC 239 coupled between the gate of the input FET 204 and the source of the input FET 204. The SIC 239 can be used either with one or with both of the previously discussed SICs 219, 229. The SIC 239 can be two-port network identical to one or both of the SICs 219, 229 or have a different range of impedances, different switch mechanism or both. The SIC 239 is in parallel with the gate to source capacitance $C_{gs}$ of the input FET 204. Accordingly, for different frequency ranges, adding additional capacitance in parallel to $C_{gs}$ can tune the input match by adjusting the series resonance consisting of the inductance 210, the gate to source capacitance $C_{gs}$ and the inductor 211. In some embodiments, the two-port network of SIC 239 includes a capacitor 241 and a switch 243. In such embodiments, activating the SIC 239 tunes the input match down in frequency. In addition, noise figure is proportional to $C_{gs}$ and also proportional to the operating frequency. Therefore, increasing $C_{gs}$ by closing the switch 243 offsets the reduction in the operating frequency that occurs when operating in the lower frequency bands. Furthermore, tuning the output network down in frequency generally increases the LNA gain. Switching in additional capacitance in the SIC 239, however, reduces the gain, thus offsetting the increase in gain and providing self-compensation for gain in both frequency ranges. Furthermore, the parasitic capacitance when the switch 243 is off (i.e., in the high frequency range) will offset the loss introduced by the switch when the switch 243 is on (i.e., in the low frequency range). Accordingly, selection of the size of the switch can assist in balancing these factors in the two frequency ranges.

In yet another embodiment, the LNA 202 has an input parallel SIC 249 coupled between the gate of the input FET 204 and ground. The SIC 249 can be used with any one or more of the other SICs 219, 229, 239. In some such embodiments, the SIC 249 includes a capacitor 214 in series with a switch 216. Turning on and off the SIC 249 alters the input impedance. Therefore, when the front end circuit operates in two different frequency ranges, each having one or more frequency bands, one of the two switch positions of the SIC 249 can be selected to set the input impedance to a value appropriate for a selected one of the two frequency ranges. For example, when the switch 214 is closed, the impedance is such that the input impedance looking into the front end circuit input port 208 will match the impedance of the source coupled to the front end circuit input port 208 when operating at frequencies within the first frequency range. Alternatively, when the switch 214 is open, the impedance looking into the front end circuit input port 208 will match the source coupled to the front end circuit input port 208 when operating at frequencies within the second frequency range.

Figure 4:
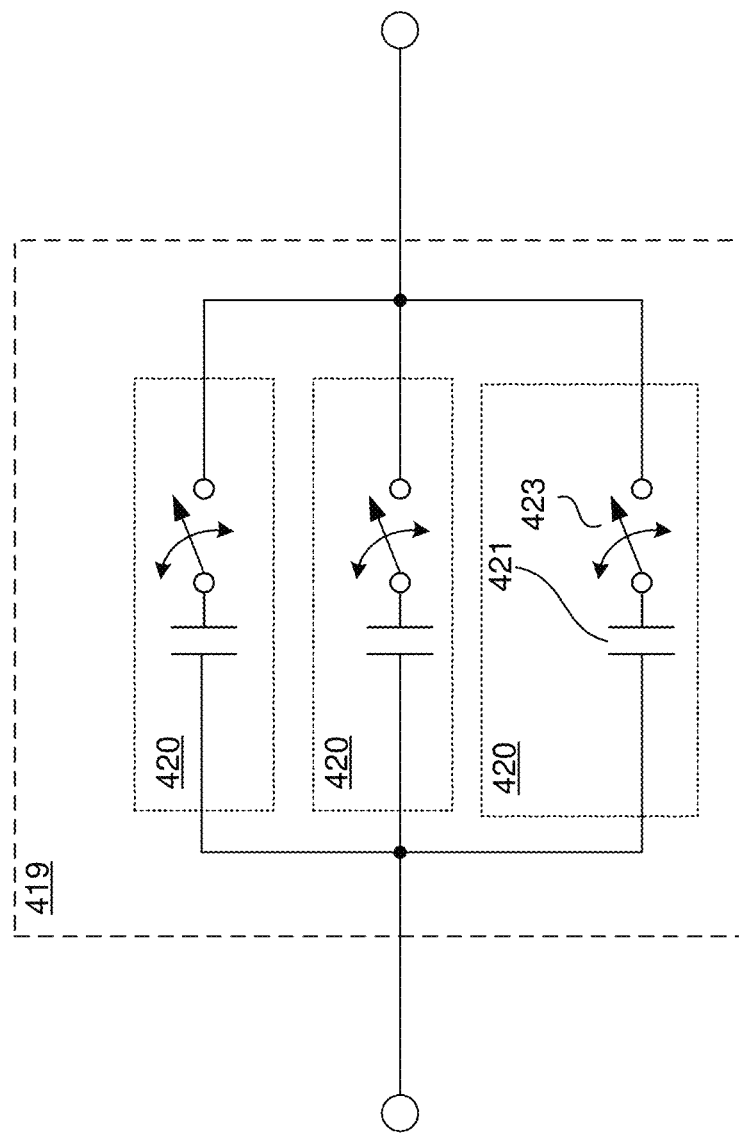
FIG. 4 is an illustration of a switched impedance circuit (SIC) in which the two-port network comprises three legs, each having a series-coupled switch and capacitor in parallel with the other legs.

FIG. 4 is an illustration of a SIC 419 in which the two-port network comprises three legs 420, each having a series-coupled switch 423 and capacitor 421 in parallel with the other legs. In some embodiments, the reactances in each leg can be band specific (i.e., selected to service a particular frequency band), or otherwise unrelated to one another. Alternatively, the reactances are proportional to one another, as is the case for binary weighted reactances. In yet other embodiments, the reactances are uniformly weighted, as in thermometer coded embodiments. In yet other embodiments, the reactances are a unique hybrid combination of values.

In one example of a binary weighed embodiment having capacitors 421, the capacitance of the first leg is half that of the second leg, which is half that of the third leg. By selectively opening and closing the switches 423 in various combinations, one of eight different values of impedance can be selected. Accordingly, using this configuration for one or more of the SICs 219, 229, 239, 249 of FIG. 2, the LNA 202 can to be tuned for operation in any of eight different frequency ranges. Similarly, various other SICs are possible which allow an impedance to be selected from among a range of impedances. However, if more than two frequency ranges can be selected, a performance penalty is incurred due to increases in the parasitics that result from introducing more switchable capacitors. Therefore, tradeoffs are required to be considered between the number of frequency ranges that are provided and the desired performance.

Figure 5:
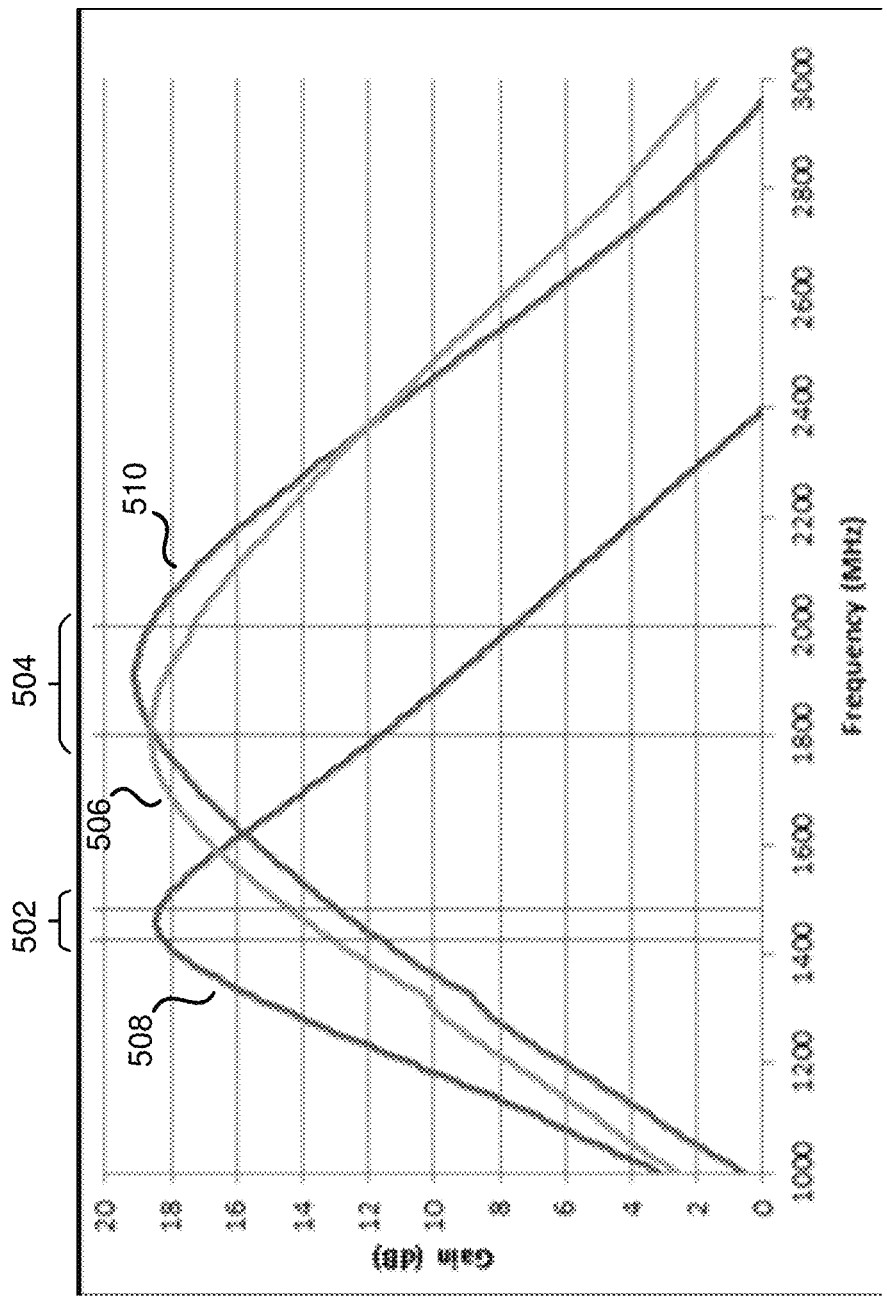
FIG. 5 is an illustration of the difference between the frequency response of an LNA operating with a wideband LNA tuned for operation over the full range of desired frequencies verses an LNA with SICs to select between a low frequency range and a high frequency range.

FIG. 5 is an illustration of the difference between the frequency response of an LNA operating with a wideband LNA tuned for operation over the full range of desired frequencies verses an LNA with SICs 219, 229, 239, 249 to select between a low frequency range 502 and a high frequency range 504. A first curve 506 illustrates the operation of a wideband LNA designed to operate in both the low frequency range 502 and the high frequency range 504. A second curve 508 shows the frequency response of the LNA 202 optimized for operation in the lower frequency range 502 by placing the SICs 219, 229, 239, 249 in the appropriate state. A third curve 510 shows the frequency response for an LNA 202 in which the switches are set to the appropriate state for operation in the high frequency range 504. It can be seen the gain is higher in higher in both the low frequency range 502 and the high frequency range 504 when the LNA 202 is tuned using the SICs 219, 229, 239, 249. In addition, the frequency response is flatter in both the low frequency range 502 and the high frequency range 504.

Figure 6:
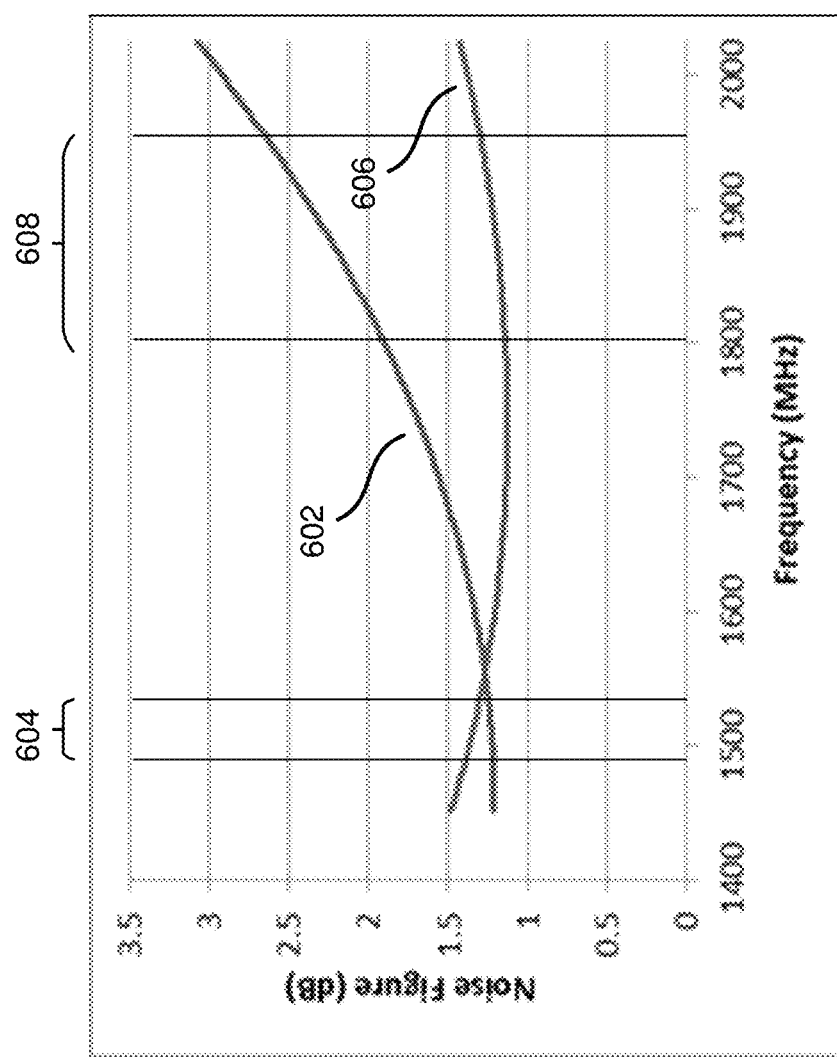
FIG. 6 is an illustration of the noise figure over the frequency range of interest.

FIG. 6 is an illustration of the noise figure over the frequency range of interest. A first curve 602 shows the noise figure for the LNA 202 operating in a low frequency range 604. A second curve 606 shows the LNA 202 operating in a high frequency range 608. It can be seen from the figure that the noise figure is both lower and more consistent in the desired frequency range when the LNA is operated with the SICs 219, 229, 239, 249 placed in the low frequency range state when operating in the low frequency range and in the high frequency state when operating in the high frequency range. Furthermore, the noise figure in the low frequency range, when operating with the SICs in the low frequency state, is essentially the same as the noise figure when the SICs are in the high frequency state and the LNA is operating in the high frequency range (i.e., approximately 1.2 dB). It should be noted that the size of the switch is a factor that should be considered in order to achieve the best possible performance with minimum noise figure and gain effects.

Figure 7:
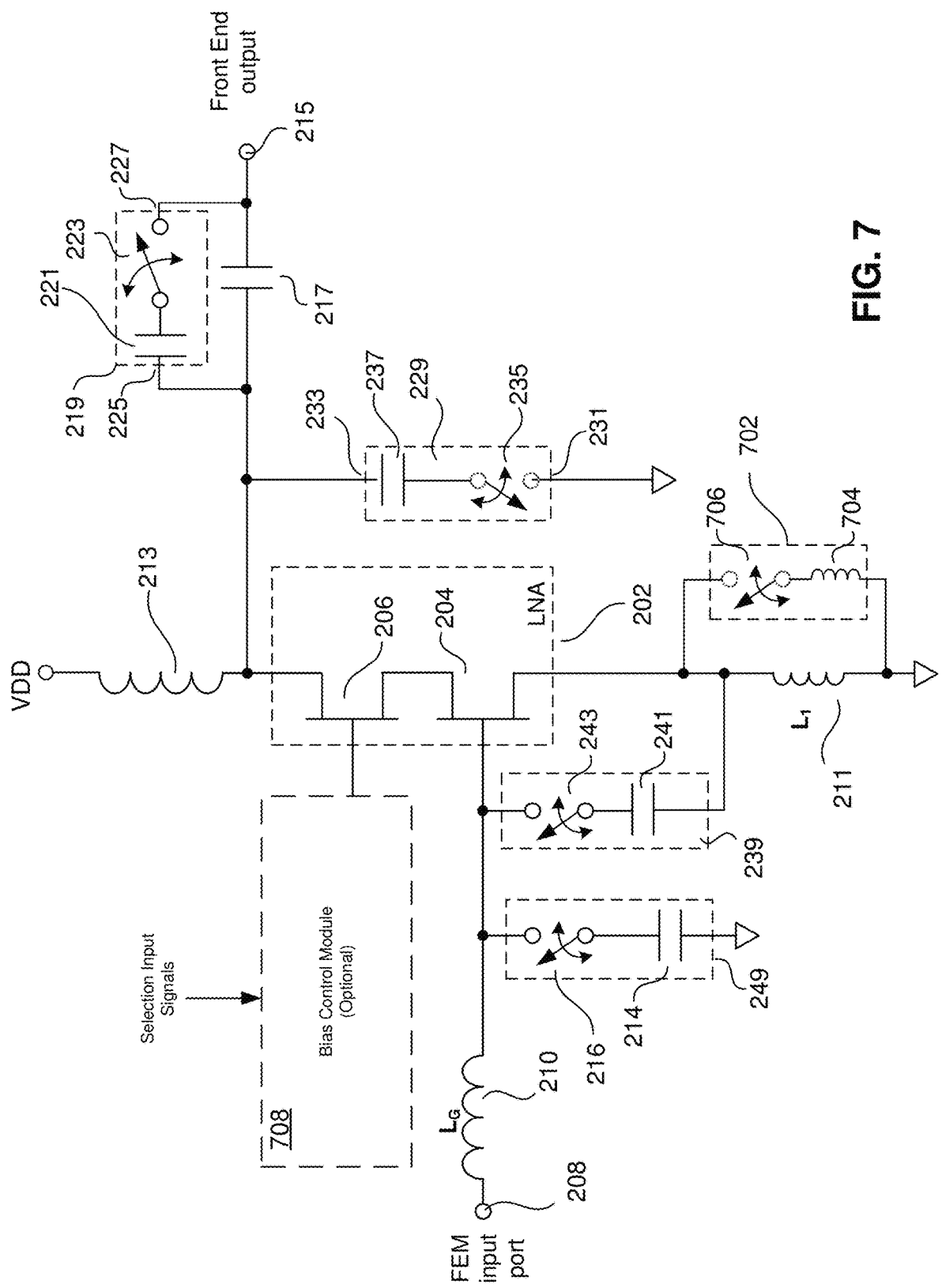
FIG. 7 is a simplified schematic of an embodiment in which a degeneration SIC is used to select an appropriate inductance value to be coupled between the source of the input FET and ground.

FIG. 7 is a simplified schematic of an embodiment in which a degeneration SIC 702 is used to select an appropriate inductance value to be coupled between the source of the input FET 204 and ground. An inductor 704 is coupled in series with a switch 706 within the SIC 702. The SIC 702 is put in parallel with the inductor 211. Accordingly, when the switch 706 is closed, the inductance coupled between the source of the input FET 204 and ground decreases due to the parallel inductance of the two inductors 704, 211 to assist with tuning the input impedance match. In some embodiments, the inductance 211 can be provided using the ground routing as the initial value to be augmented by the inductance 704 provided by the SIC 702.

In addition to the use of SICs 219, 229, 239, 249, 702, adjustments to the bias levels as controlled by signals applied to the gate of the output FET 206 can be used to optimize the performance of the LNA 202. As the bias level of the LNA 202 changes, the values for the impedances at various points in the LNA 202 can be adjusted using the SICs 219, 229, 239, 249, 702. In some embodiments, the bias can be shifted to provide greater source current through the two FETs 204, 206. Increasing the source current through the LNA 202 increases the linearity of the LNA 202 at the expense of power efficiency (i.e., increased linearity with greater DC power dissipation).

In some embodiments, a bias control module 708 provides a signal to the gate of the output FET 206 to control the bias current through the LNA 202. In some embodiments, the bias control module 708 is also responsible for controlling the switching of the SICs 219, 229, 239, 249, 702. For the sake of simplicity, the control inputs to the switches for each of the SICs 219, 229, 239, 249, 702 are not shown. However, those skilled in the art will understand that the switches can be controlled using a digital impedance selection signal coupled to an input of the switches 216, 223, 235, 243, 706, such as to the gates of FETs used to implement the switches 216, 223, 235, 243, 706. Alternatively, analog signals can be generated and coupled to the switches to modulate the effect of the SICs 219, 229, 239, 249, 702. In other embodiments, the switching within the SICs 219, 229, 239, 249, 702 can be implemented by commonly known switch circuits that do not include FETs, such as diodes or directly by varying the impedance of a variable impedance device, such as a barium strontium titanate (BST) capacitor or similarly voltage-controlled inductance.

In some embodiments, the bias control module 708 is implemented using dedicated discrete circuitry, a state machine or a programmable processor. In some embodiments, the bias control module 708 receives inputs from a central control processor (not shown) that determines the desired operational mode, including selecting between operational performance and power efficiency, and selecting the frequency range in coordination with the frequency of signals applied to the front end circuit input port 208. In some such embodiments, the selection can be made based on detection of the frequency that is applied to the front end circuit input port 208. Alternatively, the selection is made based on selection input signals based on user input or signals received from other components of the system in which the LNA 202 is being used, such as from a central processor of a cellular telephone.

By allowing selective tuning of various SICs 219, 229, 239, 249, 702 throughout the LNA design, input tuning, output tuning and performance parameters, such as noise figure, gain, linearity, input return loss, output return loss, etc. can be adjusted and optimized for particular frequency bands within frequency ranges, and tradeoffs can be dynamically made between performance parameters, such as gain and noise figure versus linearity. In addition, SICs 219, 229, 239, 249, 702 can be designed to allow selection of 2 or more operating frequency ranges to which the LNA is particularly optimized. In some cases, the operating frequency ranges can be close together (i.e., less than 5% of bandwidth) or relatively far apart (i.e., high frequency band being 3 to 4 times the bandwidth of the low frequency band). In addition, in some embodiments, the LNA can be designed to include several SICs 219, 229, 239, 249, 702, with selection as to whether to activate all of the SICs 219, 229, 239, 249, 702 being made dynamically during operation. Alternatively, a subset of the SICs 219, 229, 239, 249, 702 can be designed into the LNA 202, allowing for a smaller and more efficient design when the total flexibility of all of the SICs 219, 229, 239, 249, 702 is not necessary. The particular selection of which SICs 219, 229, 239, 249, 702 are to be provided in any particular LNA 202 depends upon the design tradeoffs that are of interest to at the time of the design.

Figure 8:
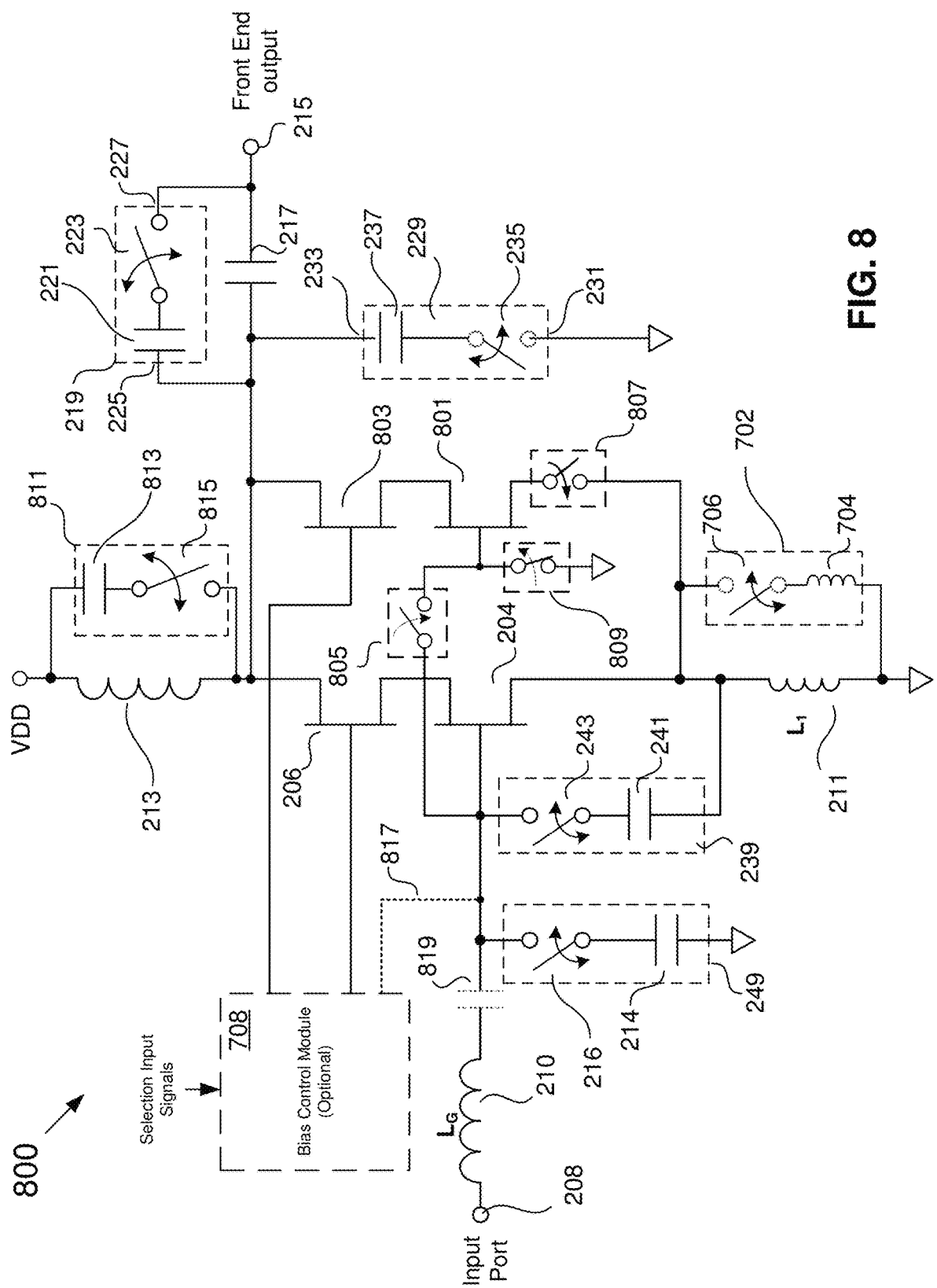
FIG. 8 is a simplified schematic of an embodiment in which in an additional active branch of FETs can be activated.

FIG. 8 is a simplified schematic of an embodiment of a front end 800 in which an additional active branch of FETs

801, 803 can be activated for greater output power, linearity, or performance versus frequency benefits. In some embodiments, the second set of FETs 801, 803 are activated by closing a gate switch 805 coupled between the gate of the input FET 801 in the first branch and the gate of the input FET 204 in the second branch. Accordingly, the gate of the input FET 801 is switchably connected to the gate of the input FET 204. In addition, in some embodiments, the gate of the output FET 803 is coupled to the Bias Control Module 708. The Bias Control Module 708 applies a bias to the gate of the output FET 803 to allow the second branch of the LNA to conduct current. In addition, in some embodiments, a source switch 807 can also (or alternatively) be used to couple the source of the input FET 801 to the source of the input FET 204 when the second branch is active. When the second branch is not active, the FETs 801, 803 can be disconnected by one or both of the switches 807, 805. In addition, a signal can be applied by the Bias Control Module 708 to the gate of the output FET 803 to stop current from flowing in the second branch. Furthermore, in some embodiments, a gate switch 809 can be closed to pull the gate of the input FET 801 to ground to ensure that FET 801 remains off (does not pick up any stray induced signals). Any one or combination of these control mechanisms can be used to control the activation of the second branch.

Adding the FETs 801, 803 has the effect of increasing the $C_{gs}$ (capacitance between the gate and source of the first input FET 204, while simultaneously increasing the $g_m$ (i.e., transconductance of the LNA). This has several performance benefits, including less degradation of the gain and noise figure when the LNA is operating at lower frequencies. Opening the gate switch 805 removes the $C_{gs}$ of the input FET 801 from being in parallel with the $C_{gs}$ of the input FET 204. In addition, in some embodiments, an optional bias signal on bias control line 817 can be applied by the Bias Control Module 708 (or by other means) to the gates of the active input FETs 204, 801. Controlling the bias level to the gates of the active input FETs 204, 801 can provide further control of the input impedance and transconductance when operating at different frequencies. In some such embodiments, an optional DC blocking capacitor 819 is placed between the bias control line 817 and the Input Port 208. Bias control lines (not shown) can be coupled to the gates of other branches 801 where more than one branch is provided. In some such cases, DC blocking capacitors (not shown) can block the bias applied to one gate from affecting the bias of the other gates. The second pair of FETs 801, 803 can be used in conjunction with all of the SICs previously discussed. Furthermore, in some embodiments, more than 2 branches can be provided. In some embodiments, FETs can either be the same or have different sizes, types, stack heights and biasing.

Further shown in the embodiment of FIG. 8 is an additional SIC 811 placed in parallel with the load inductor 213 (i.e., coupled between VDD and the drain of the output FET 206). This SIC 811 comprises an impedance element, such as a capacitor 813, and a switch 815 coupled in series with the impedance element 813. The SIC 811 can assist with output impedance matching.

Figure 9:
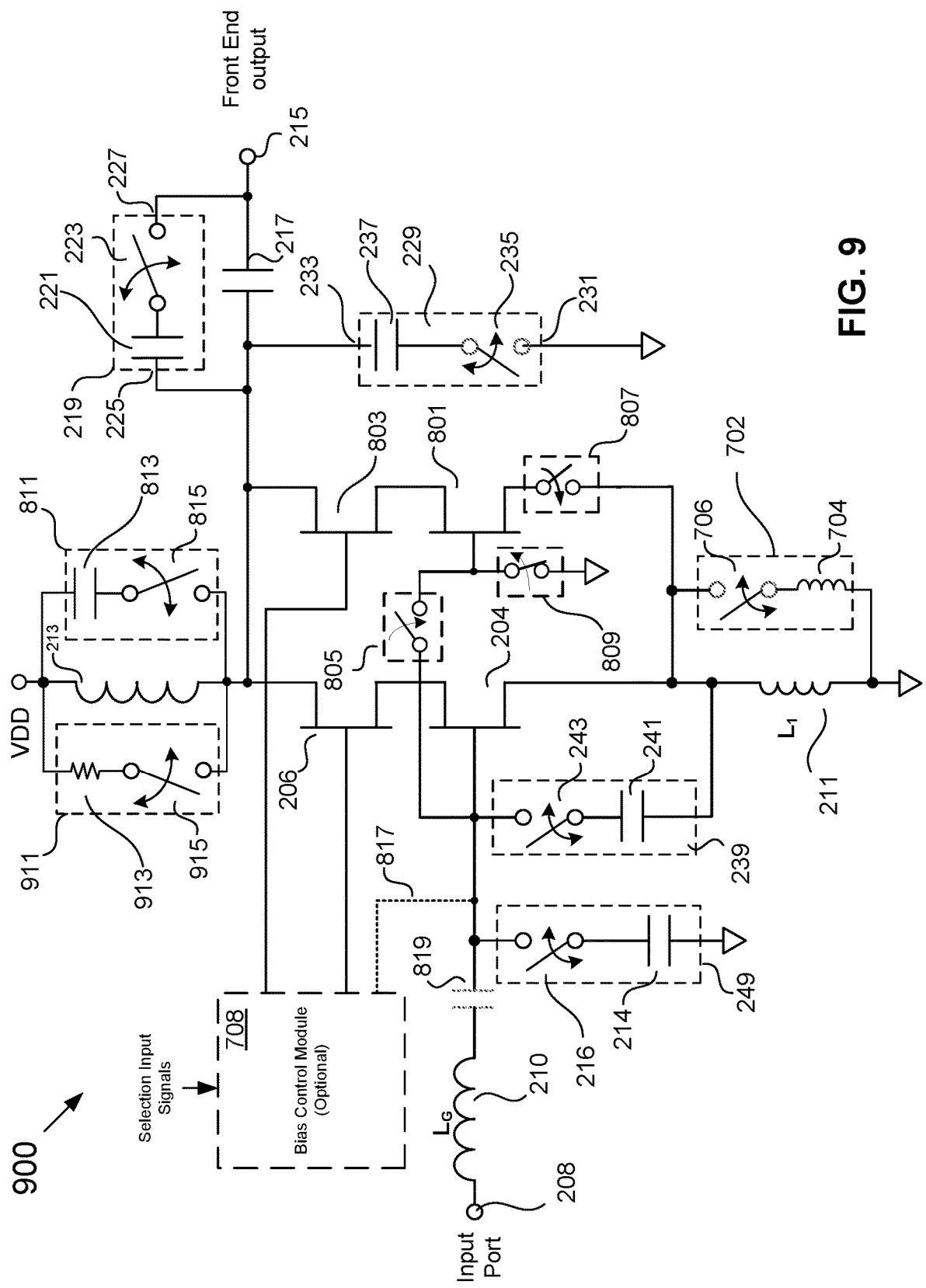
FIG. 9 is a simplified schematic of a front end circuit similar to that shown in FIG. 8.

FIG. 9 is a simplified schematic of a front end circuit similar to that shown in FIG. 8. However, an additional SIC 911 having a resistive element 913 in series with a switch 915 is placed in parallel with the load inductor 213 to reduce the Q of the inductor 213, thus providing a means for adjusting the gain of the LNA for different frequency ranges. The gain of the LNA changes in different frequency bands when the additional capacitor 813 is switched in. That is, more gain is realized in lower frequency bands with the switch 815 closed. Closing the switch 915 adds the resistor 913 to reduce the gain and thus assist in achieving the same gain in all bands. In some embodiments, the switches 815, 915 are implemented as stacked FETs. In some such embodiments, three FETs are stacked in series within the SICs 811, 911. Similar to the front end circuit 200, the front end circuit 900, nonetheless, has only one amplifier input through which input signals are coupled to the input FETs 204, 801.

Figure 10:
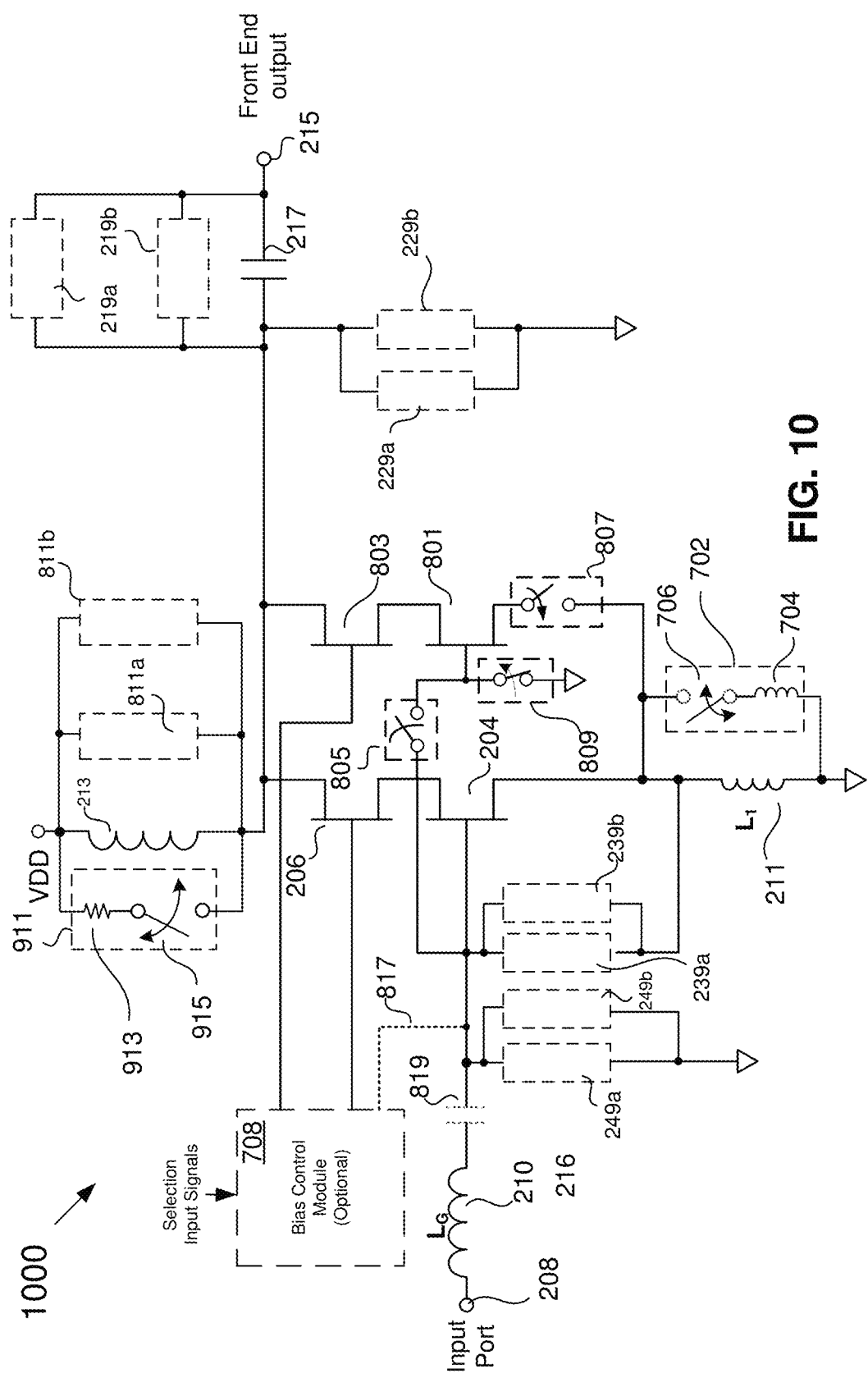
FIG. 10 is a simplified schematic of an embodiment in which several SICs can be used in parallel to provide the ability to tune the LNA for use in several different frequency bands.

FIG. 10 is a simplified schematic of an embodiment in which several SICs can be used in parallel to provide the ability to tune the LNA for use in several different frequency bands. For example, in one embodiment in which the LNA can accommodate 3 frequency bands, a second SIC 239b is coupled in parallel with the first SIC 239a. Likewise, a second SIC 249b is coupled in parallel with a first SIC 249a. In addition, two parallel coupled SICs 219a, 219b and two parallel coupled SICs 229a, 229b provide load matching for three frequency bands. Furthermore, a second SIC 811b is provided in parallel with the first SIC 811a to provide additional tuning for the three frequency bands. Similar to the front end circuit 200, the front end circuit 1000, nonetheless, has only one amplifier input through which input signals are coupled to the input FETs 204, 801.

Figure 11:
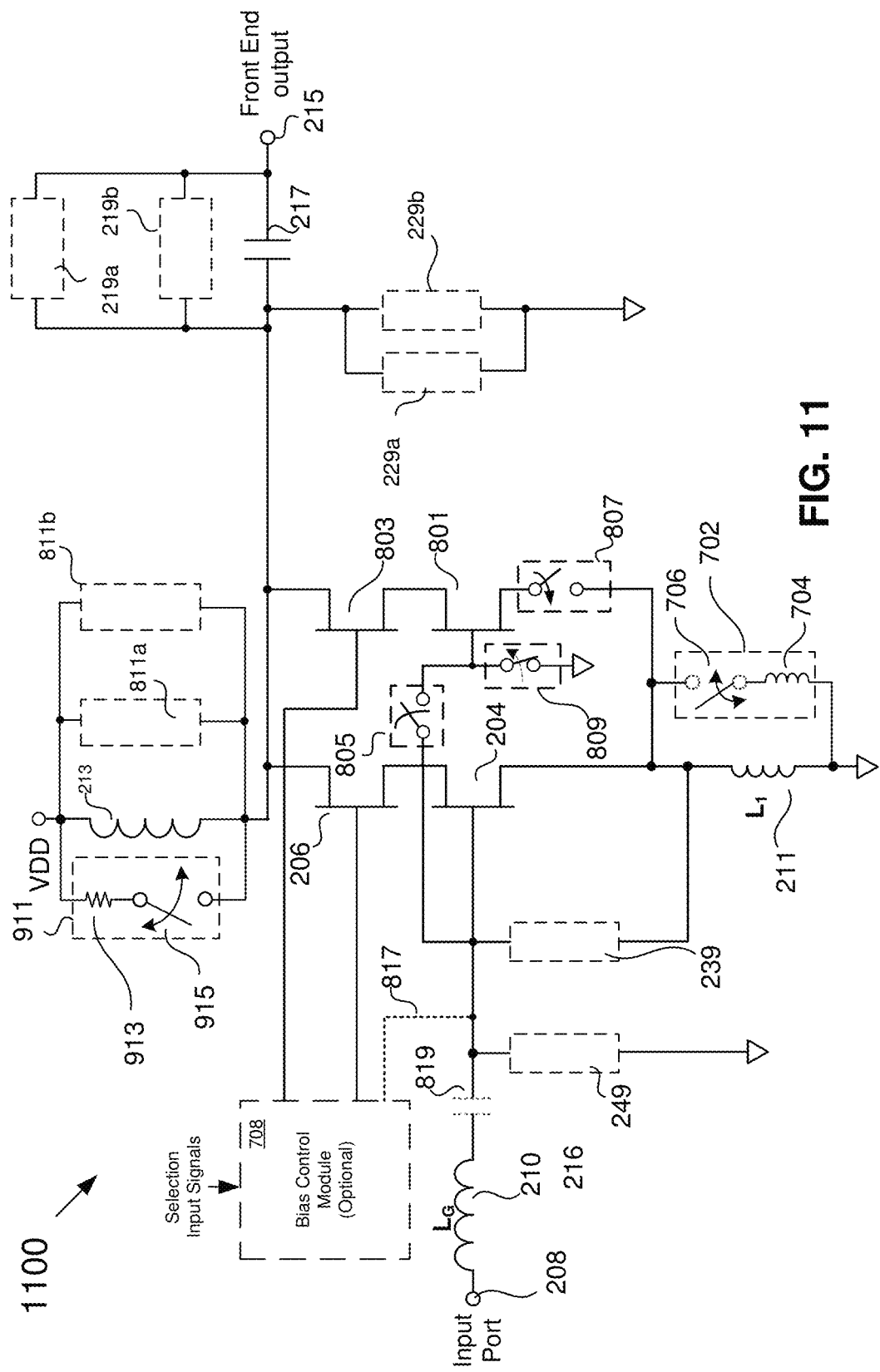
FIG. 11 is a simplified schematic of an embodiment in which adding additional capacitance at the input of the LNA might not provide an optimal embodiment.

FIG. 11 is a simplified schematic of an embodiment in which adding additional capacitance at the input of the LNA might not provide an optimal embodiment. In some such cases, a second SIC 811b is placed in parallel with the first SIC 811a, however, only one SIC 239 and only one SIC 249 are provided. Similar to the front end circuit 200, the front end circuit 1100 has only one amplifier input through which signals are coupled to the input FETs 204, 801.

Figure 12:
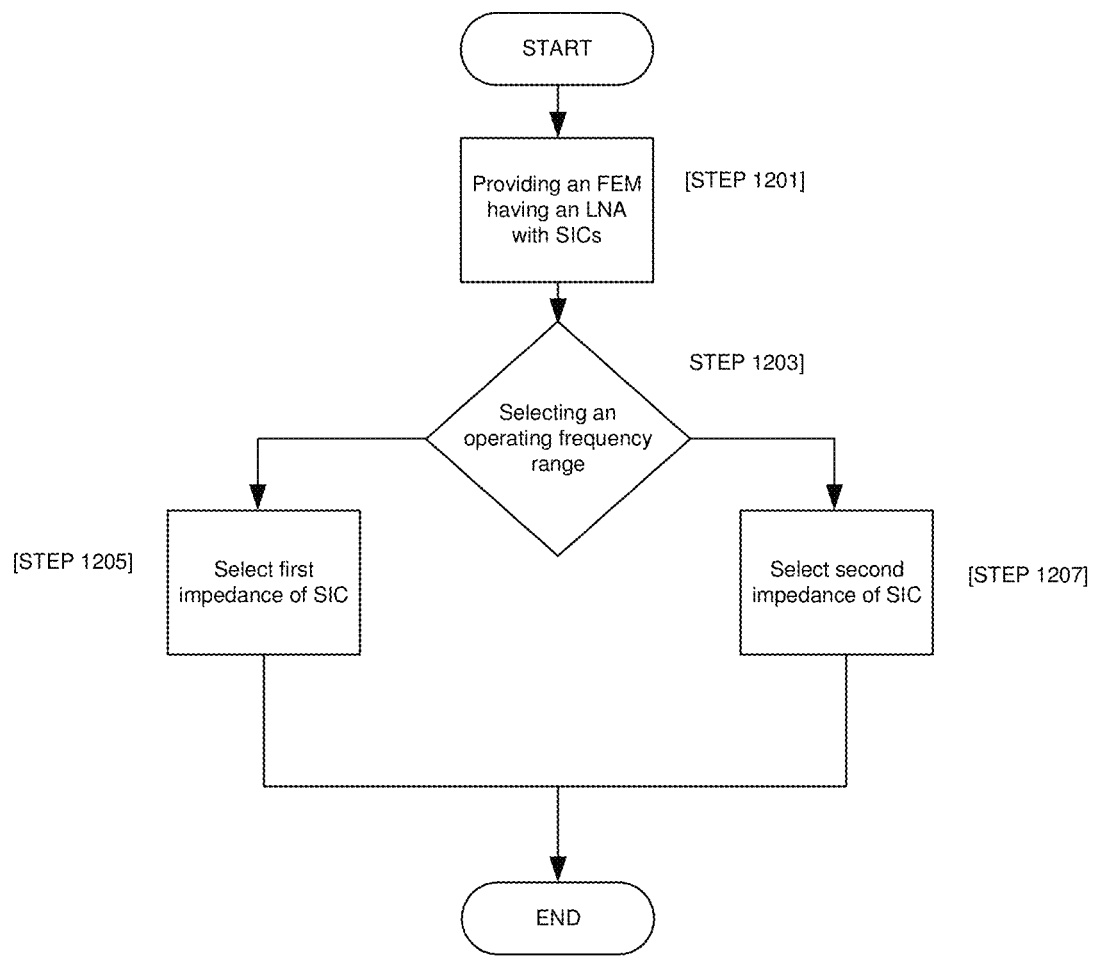
FIG. 12 is a flowchart of a method in accordance with some embodiments for amplifying signals over at least two frequency ranges, each including at least one frequency band.

FIG. 12 is a flowchart of a method in accordance with some embodiments for amplifying signals over at least two frequency ranges, each including at least one frequency band. The method in accordance with one embodiment includes providing a front end circuit having an LNA and at least one SIC 219, 229, 239, 249, 702 (STEP1201). Each SICs 219, 229, 239, 249, 702, 811 allows the impedance between a first terminal of the SICs 219, 229, 239, 249, 702, 811 and a second terminal of the SICs 219, 229, 239, 249, 702, 811 to be selected based on an input control signal. In at least one embodiment, the control signal is a digital signal applied to the gate of a FET switch within the SICs 219, 229, 239, 249, 702, 811. In some embodiments, the SICs 219, 229, 239, 249, 702 further includes a reactive device, such as a capacitor or inductor coupled in series with the switch. In other embodiments, one or more of the SICs 219, 229, 239, 249, 702, 811 provide a complex impedance coupled in series with a switch. In some embodiments, providing the front end circuit includes providing an LNA having one or more of the following SICs 219, 229, 239, 249, 702, 811:

a first SIC 219 placed between the drain of an output FET of the LNA 202 and the front end output port 215 and placed in parallel with an output matching circuit 217;

a second SIC 229 placed between the drain of an output FET of the LNA 202 and ground;

a third SIC 239 placed between the gate and source of an input FET of the LNA 202;

a fourth SIC 249 placed between the gate of an input FET of the LNA 202 and ground;

a fifth SIC 702 coupled between the drain of an input FET of the LNA 202 and ground and parallel to an inductance 211; and a sixth SIC 811 coupled in parallel with the load inductance 213.

The method further includes selecting an operating frequency range from at least two frequency ranges (STEP1203). Selecting an impedance to be imposed by the SICs 219, 229, 239, 249, 702, 811 based on the selected frequency range (STEP1205,1207). In some such embodiments, selecting the impedance includes applying a control signal to the SICs 219, 229, 239, 249, 702, 811. In some embodiments, applying the control signal includes applying the control signal to the gate of a FET switch to select between placing the FET in a conducting state or alternatively, in a non-conducting state.

As should be readily apparent to one of ordinary skill in the art, various embodiments of the invention can be implemented to meet a wide variety of specifications. Thus, selection of suitable component values are a matter of design choice (so long as the frequencies of interest mentioned above can be handled). The switching and passive elements may be implemented in any suitable integrated circuit (IC) technology, including but not limited to MOSFET and IGFET structures. Integrated circuit embodiments may be fabricated using any suitable substrates and processes, including but not limited to standard bulk silicon, silicon-on-insulator (SOI), silicon-on-sapphire (SOS), GaAs pHEMT, and MESFET processes. Voltage levels may be adjusted or voltage polarities reversed depending on a particular specification and/or implementing technology (e.g., NMOS, PMOS, or CMOS). Component voltage, current, and power handling capabilities may be adapted as needed, for example, by adjusting device sizes, "stacking" components to handle greater voltages, and/or using multiple components in parallel to handle greater currents.

A number of embodiments of the invention have been described. It is to be understood that various modifications may be made without departing from the spirit and scope of the invention. For example, some of the steps described above may be order independent, and thus can be performed in an order different from that described. It is to be understood that the foregoing description is intended to illustrate and not to limit the scope of the invention, which is defined by the scope of the following claims, and that other embodiments are within the scope of the claims.

What is claimed is:

1. A front end circuit comprising:
   at least one amplifier having a first cascode transistor and a first input transistor, the amplifier for use in at least two frequency ranges
   no more than one amplifier input
   an amplifier output;
   a front end output port;
   an output impedance matching network coupled between the amplifier output and the front end output port; and
   at least one selectable impedance circuit (SIC) comprising:
     a first and second terminal, the impedance of the at least one SIC being selected from at least two impedance values; and
   wherein the at least one SIC is a parallel-coupled output SIC having the first terminal coupled to the amplifier output and the second terminal coupled to the front end output port,
   the first input transistor has a source and
   the at least one SIC includes at least a degeneration SIC having the first terminal coupled to the source of the first input transistor and the second terminal coupled to ground.

2. The front end circuit of claim 1, wherein the degeneration SIC includes an inductor and switch coupled in series between the first and second terminals of the degeneration SIC.

3. The front end circuit of claim 1, wherein the degeneration SIC includes a two-port network capable of providing impedance and a switch coupled in series with the two-port network.

4. The front end circuit of claim 2, wherein the switch within the degeneration SIC is an FET.

5. The front end circuit of claim 1, wherein degeneration SIC further includes at least two legs coupled in parallel between the first and second terminals of the parallel-coupled output SIC, each leg including a two-port network capable of providing impedance and a switch coupled in series with the two-port network.

6. A front end circuit comprising:
   at least one amplifier having a first cascode transistor and a first input transistor, the amplifier for use in at least two frequency ranges
   no more than one amplifier input
   an amplifier output;
   a front end output port;
   an output impedance matching network coupled between the amplifier output and the front end output port; and
   at least one selectable impedance circuit (SIC) comprising:
     a first and second terminal, the impedance of the at least one SIC being selected from at least two impedance values; and
     a bias control module coupled to a gate of the first cascode transistor and configured to provide a bias control signal to the amplifier through the gate of the first cascode transistor,
   wherein the at least one SIC is a parallel-coupled output SIC having the first terminal coupled to the amplifier output and the second terminal coupled to the front end output port.

7. The front end circuit of claim 6, wherein the at least one SIC includes a control input and wherein the bias control module is further coupled to at least one of the control inputs and configured to provide an impedance selection signal to the at least one SIC.

8. The front end circuit of claim 7, wherein the bias control module generates the impedance selection signal based on the bias control signal.

9. The front end circuit of claim 7, wherein the bias control module generates the impedance selection signals and the bias control signal based on the frequency of signals applied to the front end circuit of input port.

10. A front end circuit comprising:
    at least one amplifier having a first cascode transistor and a first input transistor, the amplifier for use in at least two frequency ranges
    no more than one amplifier input
    an amplifier output;
    a front end output port;
    an output impedance matching network coupled between the amplifier output and the front end output port; and
    at least one selectable impedance circuit (SIC) comprising:
      a first and second terminal, the impedance of the at least one SIC being selected from at least two impedance values; and
    wherein the at least one SIC is a parallel-coupled output SIC having the first terminal coupled to the amplifier output and the second terminal coupled to the front end output port and the amplifier includes at least a first and second branch, an input of the first branch being switchably connected to an input of the second branch.

11. The front end circuit of claim 10, wherein the first branch of the amplifier includes the first input transistor and the first cascode transistor and the second branch of the amplifier includes a second input transistor and a second cascode transistor, a gate of the first input transistor being the input to the first branch and a gate of the second input transistor being the input of the second branch.

12. The front end circuit of claim 11, further including a switch for switchably connecting the gate of the second input transistor to ground.

13. The front end circuit of claim 11, further including a switch for switchably connecting the source of the first input transistor to the source of the second input transistor.

14. The front end circuit of claim 11, wherein the first cascode transistor has a drain and further including a load impedance coupled between the drain of the first cascode transistor and a voltage supply and further including an SIC coupled in parallel with the load impedance.

15. The front end circuit of claim 14, wherein the load impedance is an inductance.

16. The front end circuit of claim 14, wherein the SIC coupled in parallel with the load impedance includes a capacitor in series with a switch.

17. The front end circuit of claim 16, wherein the SIC coupled in parallel with the load impedance includes a resistive element in series with a switch.

* * * * *